United States Patent
Cheng et al.

(10) Patent No.: US 7,332,756 B2
(45) Date of Patent: Feb. 19, 2008

(54) DAMASCENE GATE STRUCTURE WITH A RESISTIVE DEVICE

(75) Inventors: Chung Long Cheng, Hsin-Chu (TW); Kong-Beng Thei, Hsin-chu (TW); Harry Haklay Chuang, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/285,524

(22) Filed: Nov. 21, 2005

(65) Prior Publication Data

US 2007/0114579 A1   May 24, 2007

(51) Int. Cl.
*H01L 29/76* (2006.01)
*H01L 29/66* (2006.01)
*H01L 21/8234* (2006.01)
*H01L 21/70* (2006.01)

(52) U.S. Cl. .............. 257/288; 257/E29.128; 257/E27.016; 257/E27.008; 257/E27.136; 257/330; 257/332; 257/334; 257/618; 257/632; 257/162; 257/339; 438/197

(58) Field of Classification Search ........ 257/E29.128, 257/E27.016, E27.008, E27.136, E29.135, 257/E29.267, E29.158, 288, 330, 332, 334, 257/339, 618, 620, 632, 162; 438/197
See application file for complete search history.

(56) References Cited

U.S. PATENT DOCUMENTS

| | | | |
|---|---|---|---|
| 6,465,294 B1 * | 10/2002 | Tsai et al. ................ 438/217 |
| 6,500,743 B1 * | 12/2002 | Lopatin et al. ........... 438/592 |
| 6,515,338 B1 * | 2/2003 | Inumiya et al. .......... 257/368 |
| 6,737,310 B2 * | 5/2004 | Tsai et al. ................ 438/200 |
| 6,770,501 B2 * | 8/2004 | Burnham et al. .......... 438/38 |
| 6,780,694 B2 * | 8/2004 | Doris et al. ............... 438/182 |
| 6,933,226 B2 * | 8/2005 | Lee et al. ................. 438/633 |
| 6,956,263 B1 * | 10/2005 | Mistry ..................... 257/330 |
| 7,008,832 B1 * | 3/2006 | Subramanian et al. .... 438/182 |
| 7,029,963 B2 * | 4/2006 | Abbott .................... 438/197 |
| 7,135,403 B2 * | 11/2006 | Park ....................... 438/643 |
| 7,163,886 B2 * | 1/2007 | Fujiwara et al. .......... 438/622 |
| 2001/0033000 A1 * | 10/2001 | Mistry ..................... 257/339 |
| 2002/0139933 A1 * | 10/2002 | Iida et al. ................ 250/338.1 |
| 2005/0153531 A1 * | 7/2005 | Kim ........................ 438/592 |

* cited by examiner

*Primary Examiner*—Alexander Oscar Williams
(74) *Attorney, Agent, or Firm*—K & L Gates LLP

(57) ABSTRACT

A semiconductor structure having a damascene gate structure and a resistive device on a semiconductor substrate is disclosed. The structure includes a first dielectric layer having a first opening and a second opening formed on the semiconductor substrate, and one or more sidewall spacers formed on inner sides of the first opening, in which a portion of the semiconductor substrate is exposed. In addition, the structure includes a coating layer formed on inner sides and a bottom surface of the second opening, a damascene gate structure surrounded by the sidewall spacers formed in the first opening, and a resistive device formed on the coating layer in the second opening.

20 Claims, 3 Drawing Sheets

US 7,332,756 B2

DAMASCENE GATE STRUCTURE WITH A RESISTIVE DEVICE

BACKGROUND

The present invention relates generally to semiconductor processing technology, and more particularly to a method for integrally forming a damascene gate structure and a resistive device on the same semiconductor substrate.

Radio frequency (RF) power devices require metal-oxide-semiconductor (MOS) transistors with gates of low sheet resistance. Such devices are typically used at frequencies between 900 MHz and 2 GHz for a wide variety of RF power amplifier applications, such as those in cellular handsets and telecommunication base stations. The low sheet resistance gate helps to provide large output power levels demanded by these applications. A damascene gate structure is typically used in such RF devices for lowering the sheet resistance. The damascene gate structure has a T-shaped cross-section with a top surface wider than its bottom surface. This wide top surface helps to reduce the sheet resistance of the gate structure.

An integrated circuit (IC) may include both the RF devices and other electronic elements that are used for a normal circuit operation. Some of the electronic elements may require a high resistance as opposed to the RF devices. For example, interconnects of one or more active regions on an IC chip typically require high resistance. This contradictory requirement of resistance poses a challenge to the IC manufacturing industry.

Therefore, desirable in the art of semiconductor processing technology are methods for integrally forming a damascene gate structure with a low sheet resistance and a resistive device with a high resistance on a semiconductor substrate.

SUMMARY

The present invention discloses a method for integrally forming a damascene gate structure and a resistive device on a semiconductor substrate, and a semiconductor structure constructed by the method. In one embodiment of the invention, a first dielectric layer having a first opening and a second opening is formed on the semiconductor substrate. One or more sidewall spacers are formed on inner sides of the first opening, in which a portion of the semiconductor substrate is exposed. A coating layer is formed on inner sides and a bottom surface of the second opening. A damascene gate structure surrounded by the sidewall spacers is formed in the first opening. A resistive device is formed on the coating layer in the second opening. The coating layer allows a depth of the resistive device to be shallower than that of the damascene gate structure.

The construction and method of operation of the invention, however, together with additional objects and advantages thereof will be best understood from the following description of specific embodiments when read in connection with the accompanying drawings.

DESCRIPTION

Figure 1:
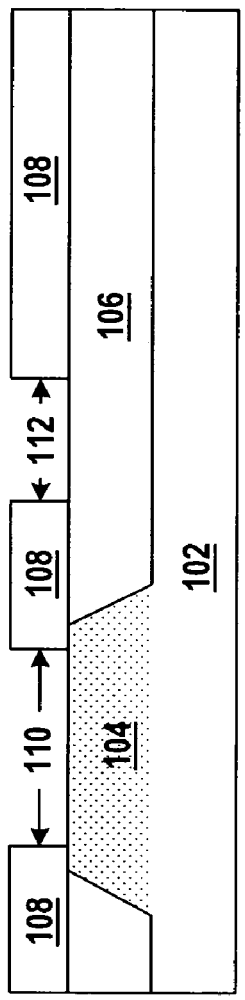
FIGS. 1 through 5 illustrate cross-sectional views of a semiconductor structure in various semiconductor processing stages for explaining a semiconductor processing method in accordance with one embodiment of the present invention.

FIG. 1 illustrates a cross-sectional view 100 of a semiconductor structure in a semiconductor processing stage for purposes of explaining a semiconductor processing method in accordance with one embodiment of the present invention. As shown, at least one active region 104 and at least one isolation structure 106 are formed on a semiconductor substrate 102. The isolation structure 106 can be a shallow trench isolation (STI) structure or a local oxidation of silicon (LOCOS) structure. A first dielectric layer 108 is formed over the active region 104 and the isolation structure 106 on the semiconductor substrate 102. The thickness of the first dielectric layer 108 depends upon the processing parameters desired, and the required performance of the transistors or other electronic devices to be constructed. The first dielectric layer 108 can be made substantially of a material, such as $SiO_2$, $Si_3N_4$, SiON, phosphosilicate glass (PSG), or borophosphosilicate glass (BPSG), by technology, such as chemical vapor deposition (CVD), low temperature vapor deposition (LPCVD), or plasma enhanced chemical vapor deposition (PECVD). One or more portions of the first dielectric layer 108 are selectively removed using well-known lithographic and etching procedures to form openings 110 and 112. The opening 110 exposes a portion of the active region 104, while the opening 112 exposes a portion of the isolation structure 106.

Figure 2:
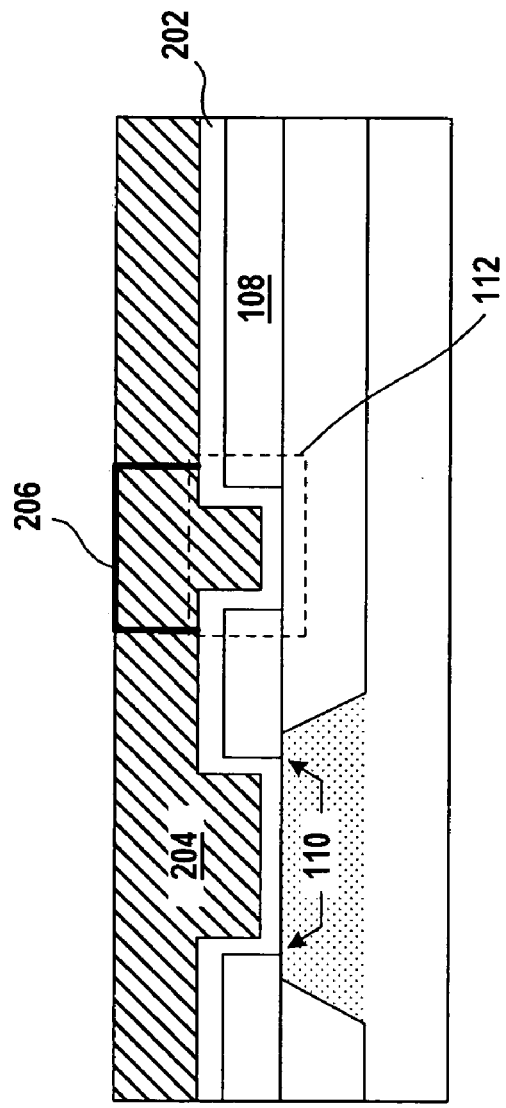

The semiconductor structure is further processed to yield a cross-sectional view 200, as depicted in FIG. 2. A second dielectric layer 202 is deposited cover the entire topography of the structure. The second dielectric layer 202 can be made substantially of a material, such as $SiO_2$, $Si_3N_4$, SiON, PSG, or BPSG, by technology, such as CVD, LPCVD, or PECVD. A layer of light-sensitive material such as a photoresist layer 204 is deposited over the entire surface of the structure. Thereafter, selected regions of the photoresist layer 204 are exposed and then removed using lithography techniques. As such, a photoresist element 206 is patterned to cover a portion of the second dielectric layer in the opening 112. The second dielectric layer 202 will be etched off such that its portion protected by the photoresist element 206 remains. The material of the photoresist element 206 is resistant to the chemicals used for etching the second dielectric layer 202, thereby creating a protection barrier for the second dielectric layer 202 in the opening 112.

Figure 3:
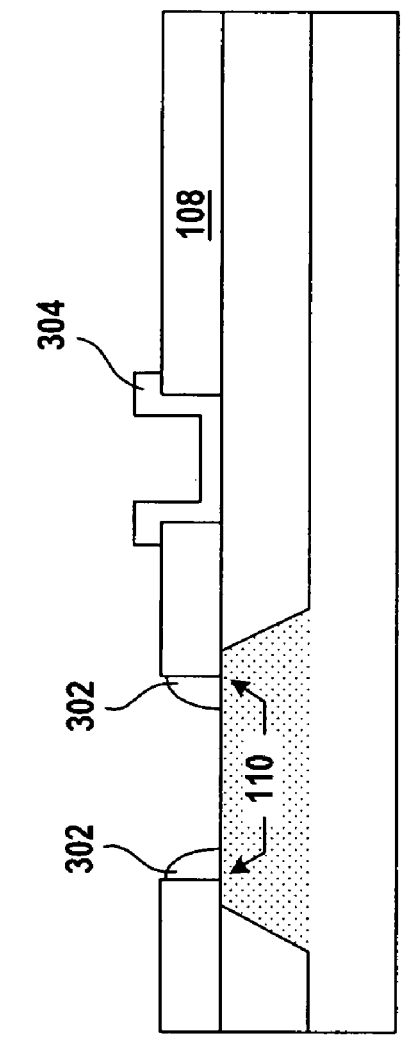

The semiconductor structure 200 shown in FIG. 2 is further processed to yield a cross-sectional view 300 as depicted in FIG. 3. An anisotropic etch is chosen to remove the second dielectric layer 202 (as shown in FIG. 2) from horizontal surfaces of the first dielectric layer 108, while retaining some material on inner sides of the first opening 110. The retained portions are henceforth referred to as sidewall spacers 302. The photoresist element 206 shown in FIG. 2 is then removed to leave a lining of the second dielectric layer 202 on the inside of the opening 112. The lining is henceforth referred to as a coating layer 304.

Figure 4:
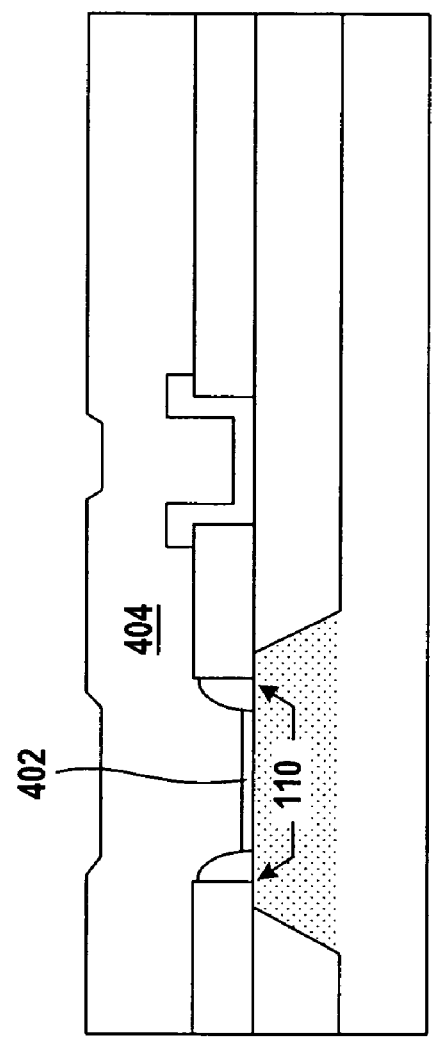

After the processing steps as discussed earlier, the semiconductor structure 300 is further processed to yield a cross-sectional view 400, as depicted in FIG. 4. A gate dielectric layer 402 is formed on the exposed surface of the semiconductor substrate in the opening 110. A poly-silicon layer 404, which can be seen as a conductive layer, is then deposited over the entire surface of the structure. A planarization step, such as chemical mechanical publishing (CMP) technology or etching back, is performed to level the surface of the poly-silicon layer 404. This yields a cross-sectional view 500 as depicted in FIG. 5.

Figure 5:
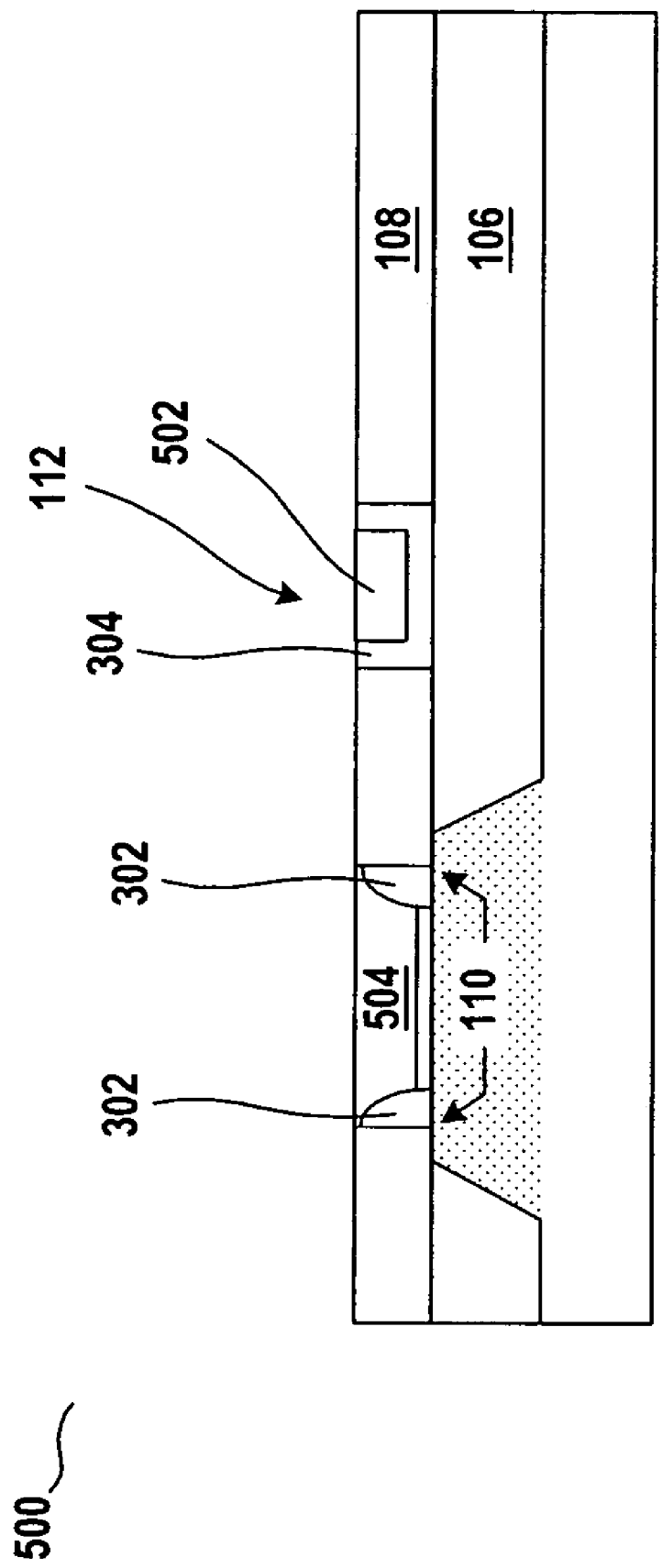

Referring to FIG. 5, the semiconductor structure includes a damascene gate structure 504 surrounded by the sidewall spacers in the first opening 110 of the first dielectric layer 108. The sidewall spacers 302 have bottom portions wider than their top portions, which provide the damascene gate structure 504 with a T-shaped body of poly-silicon. A resistive device 502 is formed on the coating layer 304, which is formed on inner and bottom sides of the second opening 112. The coating layer 304 allows a depth of the resistive device 502 to be shallower than that of the damascene gate structure 504 for increasing the resistance of the resistive device 502 as opposed to the damascene gate structure 504, due to the nature of silicon nucleation. The coating layer 304 also allows a width of the resistive device 502 to be narrower than that of the second opening 112 of the first dielectric layer 108, whose minimum dimension can be limited by a lithographic resolution. Therefore, the top surface of the resistive device 502 can be narrower than that of the damascene gate structure 504. This helps to increase the sheet resistance of the resistive device 502 as opposed to that of damascene gate structure 504. In this embodiment, the resistive device 502 is constructed above the isolation structure 106, with the coating layer 304 being in contact with the same. It is, however, noted that in another embodiment, the resistive device 502 can be formed in an area where the coating layer 304 and isolation structure 106 are not in contact.

This invention proposes a method that integrally forms a low sheet resistance gate and a high resistance resistive device. Advantages of the invention include the flexibility of defining the width and thickness of the resistive device 502 by adjusting the thickness of the coating layer 304. This method allows the resistive device 502 to have a width beyond a lithographic resolution of a conventional lithography technology. This method is applicable and can coexist with low resistance damascene gate devices. Finally, it is also contemplated that this method can also be applicable to future metal damascene gate devices as it can be used in both Si-bulk and silicon on insulator (SOI) manufacturing techniques.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure comprising:
a first dielectric layer having a first opening and a second opening overlying a semiconductor substrate;
one or more sidewall spacers on inner sides of the first opening;
a dielectric coating layer on inner sides and a bottom surface of the second opening;
a damascene gate structure surrounded by the sidewall spacers in the first opening; and
a resistive device formed on the dielectric coating layer in the second opening,
wherein the dielectric coating layer allows a depth of the resistive device to be shallower than that of the damascene gate structure for increasing a resistance of the resistive device as opposed to that of the damascene gate structure.

2. The semiconductor structure of claim 1 wherein the dielectric coating layer allows a width of the resistive device to be narrower than that of the second opening of the first dielectric layer.

3. The semiconductor structure of claim 2 wherein the damascene gate structure has a top surface wider than that of the resistive device.

4. The semiconductor structure of claim 3 further comprising an isolation structure formed under the dielectric coating layer in the semiconductor substrate.

5. The semiconductor structure of claim 4 wherein the first opening exposes an active region of the semiconductor substrate, and the second opening exposes the isolation structure thereunder.

6. The semiconductor structure of claim 5 wherein the damascene gate structure comprises a T-shaped body of poly-silicon stacked upon a gate dielectric layer formed on the exposed active region of the semiconductor substrate in the first opening.

7. The semiconductor structure of claim 6 wherein the T-shaped body of poly-silicon has a top surface wider than its bottom interface with the gate dielectric layer.

8. The semiconductor structure of claim 7 wherein the sidewall spacers has a top surface narrower than its bottom interface with the exposed active region of the semiconductor substrate.

9. The semiconductor structure of claim 1 wherein the sidewall spacers and the dielectric coating layer are substantially made of SiO2, Si3N4, SiON, phosphosilicate glass, or borophosphosilicate glass.

10. A integrated circuit chip having an internal structure comprising:
an isolation structure on the semiconductor substrate;
a first dielectric layer having a first opening exposing an active region of the semiconductor substrate and a second opening exposing the isolation structure;
one or more sidewall spacers on inner sides of the first opening;
a dielectric coating layer on inner sides and a bottom surface of the second opening;
a damascene gate structure surrounded by the sidewall spacers in the first opening; and
a resistive device formed on the dielectric coating layer in the second opening, the resistive device having a top surface narrower than that of the damascene gate structure,
wherein the dielectric coating layer allows a depth of the resistive device to be shallower than that of the damascene gate structure for increasing a resistance of the resistive device as opposed to that of the damascene gate structure.

11. The integrated circuit chip of claim 10 wherein the damascene gate structure comprises a T-shaped body of poly-silicon stacked upon a gate dielectric layer formed on the exposed active region of the semiconductor substrate in the first opening.

12. The integrated circuit chip of claim 11 wherein the T-shaped body of poly-silicon has a top surface narrower than its bottom interface with the gate dielectric layer.

13. A semiconductor structure comprising:
a first dielectric layer having a first opening and a second opening overlying a semiconductor substrate;
one or more sidewall spacers on inner sides of the first opening;
a dielectric coating layer on inner sides and a bottom surface of the second opening;
a gate dielectric layer on the bottom surface of the first opening;
a damascene gate structure formed on the gate dielectric layer and surrounded by the sidewall spacers in the first opening; and
a resistive device formed on the dielectric coating layer in the second opening,
wherein the coating layer allows a depth of the resistive device to be shallower than that of the damascene gate structure for increasing a resistance of the resistive device as opposed to that of the damascene gate structure.

14. The semiconductor structure of claim 13 wherein the damascene gate structure has a top surface narrower than that of the resistive device.

15. The semiconductor structure of claim 13 further comprising an isolation structure formed under the dielectric coating layer in the semiconductor substrate.

16. The semiconductor structure of claim 13 wherein the gate dielectric layer is formed on an active region of the semiconductor substrate in the first opening.

17. The semiconductor structure of claim 13 wherein the damascene gate structure comprises a T-shaped body of poly-silicon stacked upon the gate dielectric layer.

18. The semiconductor structure of claim 13 wherein the sidewall spacers and the dielectric coating layer are substantially made of SiO2, Si3N4, SiON, phosphosilicate glass, or borophosphosilicate glass.

19. The semiconductor structure of claim 13 wherein the dielectric coating layer allows a width of the resistive device to be narrower than that of the second opening of the first dielectric layer.

20. The semiconductor structure of claim 13 wherein the resistive device comprises a planarized polysilicon layer in the second opening.

* * * * *